(12) United States Patent
Retzlaff

(10) Patent No.: US 7,564,672 B2
(45) Date of Patent: Jul. 21, 2009

(54) TRANSFER-ESC BASED ON A WAFER

(76) Inventor: Udo Heinz Retzlaff, In der Molzkaute 31, Kreuztal, NRW (DE) 57223

(\*) Notice: Subject to any disclaimer, the term of this patent is extended or adjusted under 35 U.S.C. 154(b) by 276 days.

(21) Appl. No.: 11/455,208

(22) Filed: Jun. 19, 2006

(65) Prior Publication Data

US 2007/0014073 A1 Jan. 18, 2007

(30) Foreign Application Priority Data

Jul. 18, 2005 (DE) .................. 20 2005 011 367 U

(51) Int. Cl.
*H02N 13/00* (2006.01)
*H01H 23/00* (2006.01)

(52) U.S. Cl. ...................................... 361/234
(58) Field of Classification Search .................. 361/234
See application file for complete search history.

(56) References Cited

U.S. PATENT DOCUMENTS

| 4,184,188 | A | 1/1980 | Briglia ........................ 361/234 |
|---|---|---|---|
| 4,384,918 | A | 5/1983 | Abe ............................ 156/643 |
| 4,480,284 | A | 10/1984 | Tojo et al. ................... 361/234 |
| 4,551,192 | A | 11/1985 | Di Milia et al. ............. 156/345 |
| 4,692,836 | A | 9/1987 | Suzuki ........................ 361/234 |
| 4,724,510 | A | 2/1988 | Wicker et al. ............... 361/234 |
| 5,151,845 | A | 9/1992 | Watanabe et al. ........... 307/130 |
| 5,572,398 | A | 11/1996 | Federlin et al. ............. 361/234 |
| 6,174,583 | B1 | 1/2001 | Yamada et al. ............... 428/67 |
| 7,027,283 | B2 * | 4/2006 | Landesberger et al. ...... 361/234 |
| 7,336,015 | B2 * | 2/2008 | Arlt et al. ................... 310/309 |
| 2004/0037692 | A1 | 2/2004 | Landesberger et al. ...... 414/935 |

FOREIGN PATENT DOCUMENTS

| DE | 203 11 625 | 11/2003 |
|---|---|---|
| DE | 10 2004 041 049 | 1/2006 |
| DE | 10 2004 030 723 | 2/2006 |
| EP | 0 880 818 | 12/1988 |
| EP | 0 460 955 | 12/1991 |
| EP | 0 692 814 | 1/1996 |
| EP | 0 805 487 | 11/1997 |
| EP | 1 070 381 | 1/2001 |
| EP | 1 217 655 | 6/2002 |

\* cited by examiner

*Primary Examiner*—Ronald W Leja
(74) *Attorney, Agent, or Firm*—Collard & Roe, P.C.

(57) ABSTRACT

A mobile transportable electrostatic chuck for clamping thin wafers (12) without permanent connection to an external power supply unit is described. The mobile chuck allows a safe handling of thin substrates on existing production equipment because the size and thickness of the clamped substrate on the mobile chuck is similar to a standard wafer. The chuck is made from silicon wafers itself as base material (11) using an IC manufacturing processes. Bipolar electrode-unit-cells (10), combined into clusters (4) and linked to an integrated fuse (5), generate a non-uniform electric field with additional force components. Peak-electrodes (1) are introduced with the highest field density in the peak region and thus creating a three dimensional non-uniform electric field with each surrounding electrode (3). Quadratic or hexagonal electrode-unit-cells (10) enable the highest dense of unit cells, which effectively clamp wafers (12) in close proximity to the surface (8a) of the chuck at elevated temperatures.

7 Claims, 3 Drawing Sheets

Transfer-ESC based on a wafer

Transfer-ESC based on a wafer

TRANSFER-ESC BASED ON A WAFER

FIELD OF THE INVENTION

The present invention relates to an electrostatic chuck for wafers and especially to mobile, transportable electrostatic chucks (Transfer-ESC) were the mobile carrier keeps clamping a thin wafer after charging (applying a clamping voltage) without permanent connection to an external power supply unit for transportation or other process steps up to several hours.

BACKGROUND OF THE INVENTION

Mobile, transportable electrostatic chucks (Transfer-ESC) are used as mechanical support carriers for thin substrates. This technology is applied for the manufacturing of Integrated Circuits (IC's) within the semiconductor industry. The tendency to thinner chips or wafers is shown on RFID-Chip-products as well as for Power-Chips and many different other applications. Those support carriers allow a safe manipulating of thin, brittle wafers on existing production equipment because the size and thickness of the clamped substrate on the mobile, transportable electrostatic chuck is similar of size, thickness and shape as a standard wafer. An advantage of the support carrier technique is the reversible clamping of the transport substrates outside of the production equipment. Besides, after charging the Transfer-ESC, they do not need additional, external current or voltage power supply for a long period of time. For this reason the package of Transfer-ESC and thin wafer can be handled as a normal thick wafer. The existent transport- and process equipment (grinding-, etch- or polishing equipment, Implanter, PVD-, Sputter- or CVD-tools—see DE 203 11625 U1) can be employed further more. After a completed process step, the thin wafer or the separated chips can be taken off form the Transfer-ESC after deactivating the electrostatic clamping force or it can be recharged again. The Transfer-ESC is reusable.

Similar problems as described are found in other industrial branches like the medicine-, solar- or display-industry. As used herein, a "wafer" encompasses any of the various types of substrates that can be held on a chuck, including semiconductor wafers, glass or ceramic plates, or any of various other suitable substrates.

State of the art for 150 µm thin wafers is the use of polymer protection foils for mechanical stabilisation. This support technique seams applicable for a wafer thickness down to 100 µm. The attached/glued protection foils must be peeled off mechanically after later process steps. This can lead to a breakage of the brittle, sensible wafers. The disadvantage of this technique is that the foils are not reusable and they are not resistant against higher temperatures. There application is limited to process steps were the temperature is less than 150 degree Celsius.

Alternatively, Transfer-ESC can be employed as stabilising carriers instead of foils. The connection of a thin wafer and the Transfer-ESC is carried out by applying a clamping voltage (typically 300 V to 3000 V). An electrostatic field will be created between the electrode structure within the Transfer-ESC and the wafer. The resulting clamping force is similar to Coulomb forces of a plate capacitor. After clamping the Transfer-ESC with the attached wafer, it can be transported or processed without any further connection to a voltage or current supply system. After a couple of hours, another recharging of the Transfer-ESC is necessary, because the leakage currents of the capacitor structure (typically <5 nA at room temperature) discharge with time and the clamping forces are reduced. This can lead up to a loss of the clamped wafer.

In EP 1217655 A1 a method of manipulating thin wafers is described, which is using the term "Transfer-ESC" the first time for transportable, electrostatic chucks. Within US 2004/0037692 A1 Landesberger et al. describes electrodes, which are arranged in a matrix. By providing the electrode structure in the form of a matrix, individual chips can be removed "pixelwise" by reversing the polarity of respective electrodes of the matrix. Landesberger et al. describes in FIG. 2 a round structure, which consists of quarter-circular-segment electrodes. Each two of the quarter-circular segments are connected to each other and once activated they are on a positive (+) or negative (−) potential. For de-chucking of an earlier separated chip, the appropriate electrode structure is deactivated using the matrix structure and by reversing the polarity of at least two of the quarter-circular-segments the chip can be taken off.

In contradiction to mobile, transportable electrostatic chucks, stationary electrostatic chucks (ESC) are used to clamp wafers in manufacturing tools for the chip industry for decades. Stationary ESC as well as end effectors differentiating in a way that they are permanently connected to a power supply unit and thus they are not mobile. For this reason leakage current in respect of a non sufficient power supply has been of less interest. Those ESC are mostly modified to achieve fast chucking and de-chucking cycle times. Besides, many different designs for electrode structures have been developed. Some examples for unipolar, bipolar and multipolar electrode structures are found in U.S. Pat. No. 4,551,192, U.S. Pat. No. 4,480,284, U.S. Pat. No. 4,184,188, U.S. Pat. No. 4,384,918, U.S. Pat. No. 4,692,836, U.S. Pat. No. 4,724,510, U.S. Pat. No. 5,572,398, U.S. Pat. No. 5,151,845, U.S. Pat. No. 6,174,583, EP 0692814, EP 0460955, EP 1070381. In EP 0880818 B1 a low voltage electrostatic clamp is described. The clamping force is not only depending on the applied voltage but is also significantly influenced by the structure of the electrodes. The formula how to calculate the value of Coulomb forces for unipolar and bipolar chucks is known from analogous considerations of plate capacitors. By using two differently charged long elongated serpentine like allocated electrodes with a width of <100 µm and the spacing between the electrodes of less than 100 µm it was found that clamping forces are improving and were higher than expected. It is argued, that they have created a non-uniform electric field. This non-uniform electric field has an additional force component. Dielectric objects (wafer) can be electrostatically clamped by immersing the object in a non-uniform electric field. The non-uniform electric field produces a force which tends to pull the dielectric object into the region of the highest electric field. For this reason the same clamping force was achieved with a reduced applied clamping voltage. By using a flat-panel-display (AMLCD) manufacturing technology, the smallest width of the electrodes in there array of electrodes was 20 µm and the deposited dielectric layer has had a thickness of 5 µm. The needed clamping voltage was less than 1 kV. State of the art types of stationary ESC use widths of the electrodes of about 3 mm and the spacing between the electrodes is about 1 mm. Typically they work with clamping voltages in the range of 1 kV to 3 kV. The used thickness of the dielectric layer is in the range of 10 µm to 500 µm. Different thick-film technologies are applied to produce stationary ESC. EP 805487 A2 describes the use of fuses to electrically disconnect a failed electrode from the output terminal. This application is related to a stationary ESC which is permanently connected to a power supply unit. The resistor fuses are constructed from resistive materials like nickel-phosphorous, nickel-chromium or others with a length of up to 5 mm. The disadvantage of those types of fuses is that they are not able to be integrated using a suitable thin-film technology.

The proposed solutions do not fulfil further technical and commercial requirements to mobile, transportable electrostatic chucks. Although the risk of breakage of thin (<150 μm) and ultra thin (<50 μm) substrates is drastically reduced by using Transfer-ESC during the manufacturing and transport of wafers, the clamping power is still problematic for some process steps. Those process steps are CVD-, metallization- and anneal processes, which are carried out at temperatures up to 750 degree Celsius. The clamping force of Coulomb chucks is proportional to the square of the applied clamping voltage (U), the dielectric constant ($\in_r$) of the insulator layer and is indirectly proportional to the square of the thickness of the insulator layer (d). Thus, a strong electrostatic holding force is obtained by having a high clamping voltage (U>1000 V) with a high dielectric constant of the material ($\in_r$) is 3.5 to 9) and a very small thickness of the insulation layer. Most of the typical used dielectric materials, as described and cited in the patents above, show a significant decrease of there insulation behavior at elevated temperatures of about 250 degree Celsius. This is causing high leakage currents and thus only a short clamping time. A major drawback is also that a single defect of the dielectric layer can cause a disaster fault of the Transfer-ESC.

BRIEF SUMMARY OF THE INVENTION

In view of the shortcomings described above, the object of the invention is to produce mobile, transportable electrostatic chucks (Transfer-ESC) at a reasonable cost which work at elevated temperatures with low leakage currents, which create a high, preferable increased clamping force and is still able to work if there are some defects within the dielectric layer.

According to the invention the solution of a new type of mobile, transportable electrostatic chucks is described in claim 1. A plurality of electrode-unit-cells, which are modular combined into clusters, are used to generate additional force components by applying non-uniform electric fields. Each cluster of electrode-unit-cells is connected to at least one integrated fuse which is disconnecting defective clusters. In this way the objective of the invention is fulfilled.

In order to create a high amount of bipolar electrode-unit-cells, thin-film techniques known from the manufacturing process of Integrated Circuits (Chips) are applied. Each electrode-unit-cell, in accordance with the invention, consists of one inside peak-electrode, a lateral insulator layer, one surrounding electrode and a top dielectric layer. It is known that $SiO_2$ has a high breakdown voltage of up to 1000 V per μm. Besides, it is possible to create very pure and defect free silicon dioxide layers which generate only small amounts of leakage currents at 300 degree Celsius. Taking into account that breakdown voltages from 200 V to 2000 V are needed, the width of the lateral insulating layer is 2 μm, which is separating the peak-electrode from the surrounding electrode.

Quadratic or hexagonal shapes of electrode-unit-cells enable the highest dense of unit cells on a surface. Up to date line width of 0.5 μm and below are widely used for IC manufacturing. Taking this into account a quadratic electrode-unit-cell should have a peak-electrode of 0.5 μm*0.5 μm, the lateral insulator layer needs to have a width of 2 μm and the line width of the surrounding electrode is 0.5 μm. Using those dimensions a lattice constant of 5 μm of a quadratic unit cell can be calculated. If, by example 6*6 electrode-unit-cells are modularly combined into one cluster, each cluster would have a surface area of 30*30 μm$^2$. Each cluster is connected to at least one fuse. This fuse will disconnect the electric link to the cluster if the current density is too high. This, for instance, can be created by a defect within the top dielectric layer. A typical defect size during the IC manufacturing process is in the range of 1 μm or smaller. This defect can course a local limited leakage current, an electric shock current which is much higher than the normal leakage current. This electric shock current can be as high as a few mA and melts the fuse, because the current density of the fuse material is above the critical limit for a short period of time. Therefore the contact to the cluster will be disconnected. Electrodes itself are build up from many of those clusters and for this reason the functionality of the electrode will not be impacted seriously by a local defect. The integrated fuses are properly designed, what means that the charging and de-charging procedure of a Transfer-ESC is not impacted. All experience shows that a defect will be recognized during the charging procedure of the Transfer-ESC. The charging of a Transfer-ESC is carried out with a rising clamping voltage but with a limitation of the charging current from 30 to 300 μA. Just this small and tightly controlled charging current, distributed by a bus-system to a high amount of integrated fuses (up to one million or more), enables a technical reliable solution for the use of fuses within a thin-film technology and thus a complete integration in the manufacturing process, known from semiconductor IC-technologies. If one cluster is destroyed during the charging procedure, the Transfer-ESC, which is using a million of those clusters, still remains its functionality. Considering an electrode-unit-cell build up with a 5 μm lattice, the resulting cluster density is 1,000 clusters per square millimeter. Adapted to a 150 mm Transfer-ESC it means that there are more than 500,000,000 single, active electrode-unit-cells.

BRIEF DESCRIPTION OF THE DRAWINGS

The description of the drawings below includes a recitation of preferred and exemplary features. It is to be understood that each of the features can be used in the invention in general, not merely in the context of the particular drawings, and the invention includes any combination or two or more of these features. A representative embodiment of the invention is explained referring to the attached drawings.

DESCRIPTION OF THE PREFERRED EMBODIMENTS

Figure 1A:
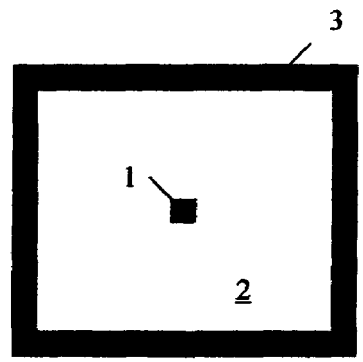
FIGS. 1a and 1b show a top view of a quadratic and a hexagonal electrode-unit-cell respectively.
Figure 1B:
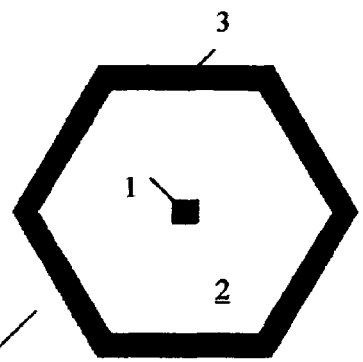
Figure 2:
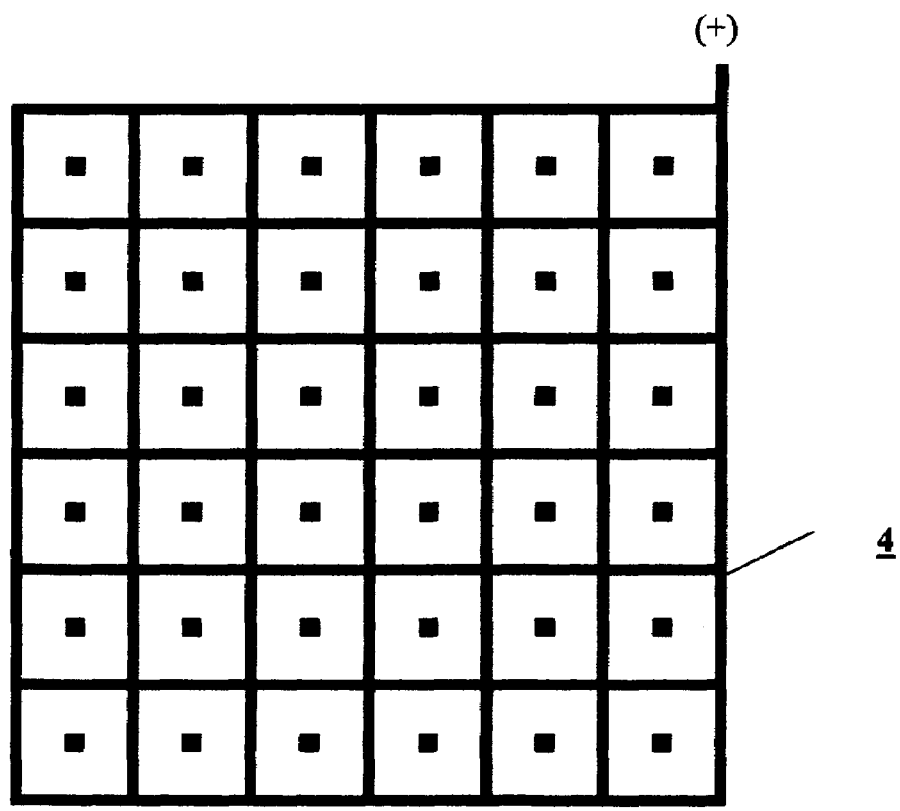
FIG. 2 shows a top view of a cluster of electrode-unit-cells.

FIG. 1a shows a quadratic and FIG. 1b a hexagonal shape of an electrode-unit-cell (10). It is build up with one inside peak-electrode (1), a lateral insulator layer (2), one surrounding electrode (3) and a top dielectric layer (8). The material of choice for the inside peak-electrode (1) and the surrounding electrode (3) can be electrical conducting metals like cupper, alumina or tungsten or also highly doped poly-silicon or amorphous silicon can be employed. The used materials for the dielectric layers (2,8) are typically thermal grown-, CVD- or plasma oxides, nitrides or other suitable non conductive layers or combinations of such layers. By attaching the electrode-unit-cells (10) on each other, a complete coverage of the surface, as seen in FIG. 2, is achieved. In this case a cluster (4) of 6*6 electrode-unit-cells (10) is described.

Figure 3:
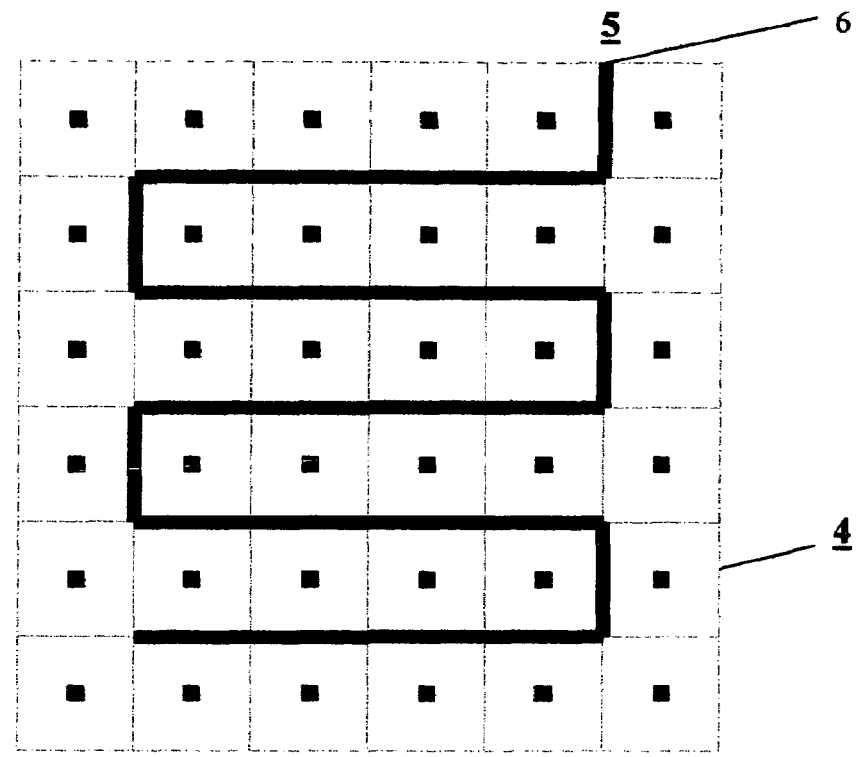
FIG. 3 shows a top view of an integrated fuse, the positioning of the cluster is indicated with dotted lines.
Figure 4:
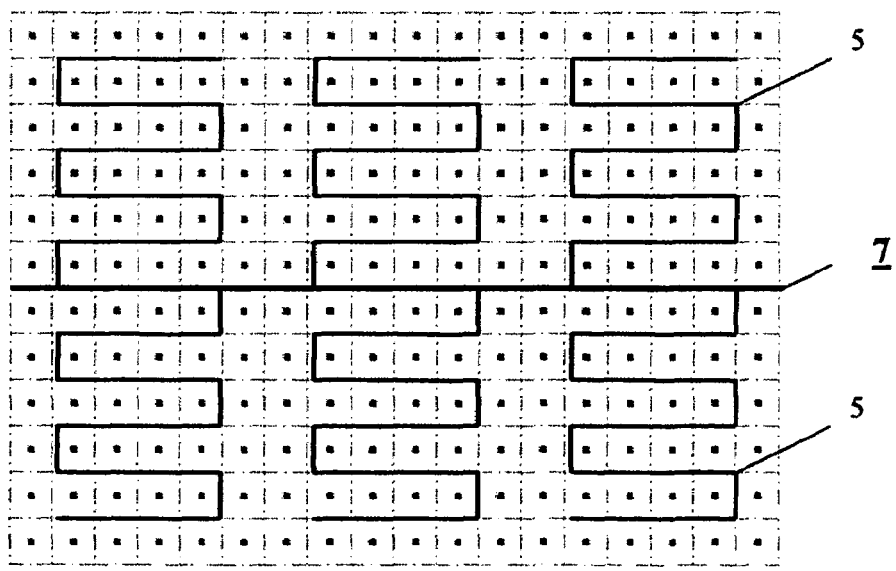
FIG. 4 shows a top view of a section of a bus-system.

As normal for IC manufacturing technologies, many different functional levels can be allocated above each other. So an integrated fuse (5) can be positioned directly below of each cluster (4). FIG. 3 shows an integrated fuse (5) with a serpentine like allocated line (6). The conductive line (6) is designed to achieve a lengths- to width-relation of typically 300 to 1. The resistance of the integrated fuse (5) in this embodiment is designed to reach more than 10,000 Ohm. This is achieved by using amorphous or poly-crystalline silicon lines with an appropriate doping. But also the use of a thin metal layer is possible. In FIG. 3 a 125 µm long conductive line (6) is shown, which is melting and cuts off the contact of the cluster (4) to a bus-system (7) in case of an electric shock current. Singular integrated fuses (5) will be connected by a bus-system (7) to each other, as seen in FIG. 4.

Figure 5:
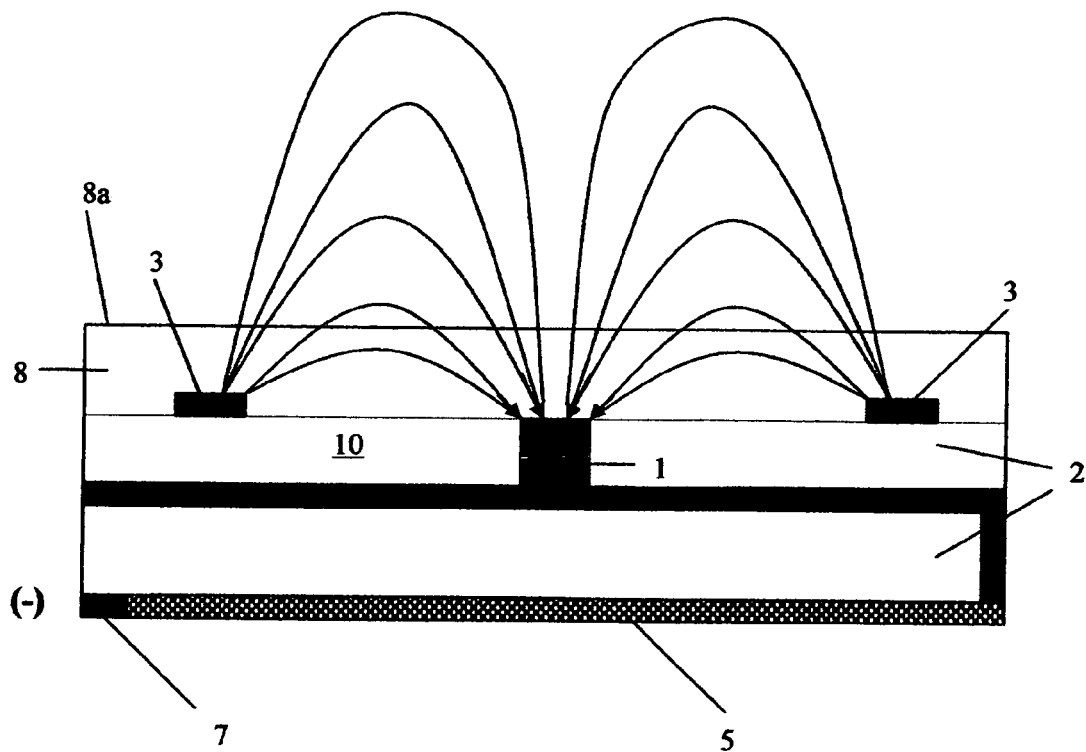
FIG. 5 shows a cross section view of an electrode-unit-cell with an integrated fuse in the second level and as part of the bus-system.

FIG. 5 shows an electrode-unit-cell and its electric field. Here the cross section view of an electrode-unit-cell (10) with integrated fuse (5) in the second level and as part of the bus-system (7) is seen. In this embodiment the bus-system (7) is linked via the integrated fuse (5) to the cluster (4), which is built up from 36 peak-electrodes (1). All these parts have the same electrical potential, in this case negative (−). The surrounding electrode (3) has a positive potential (+), as seen in FIG. 2. In order to highlight the non-uniform electric field, lines with an arrow from (+) to (−) are indicating the field lines. This non-homogeny, non-uniform electric field is very strong, especially in close proximity, only a few µm away, to the top dielectric layer (8) of the Transfer-ESC. The unique shape of the non-uniform electric field is significantly created by using a peak-electrode (1). The density of the field lines is higher close to the peak-electrode (1) than in the area which is near by the surrounding electrode (3). Although the area of the surrounding electrode (3) is about 10 times bigger than the area of the peak-electrode—and for this reason the probability to have a defective top dielectric layer (8) seems to be higher-in this embodiment the integrated fuse (5) electrically connects in series to the peak-electrode (1). In another embodiment the fuse (5) could also electrically connect in series to the surrounding electrode (3). Even a few 10 µm apart from the surface of the Transfer-ESC (8a), which is in direct contact to the clamped wafer (12), the field lines are nearly parallel to the surface and they are nearly homogenous. That's why the effect that a dielectric object-process-wafer (12)-can be electrostatically clamped by immersing the object in a non-uniform electric field, where the non-uniform electric field produces a force which tends to pull the dielectric object into the region of the highest electric field, is only effective in a close proximity to the surface of the Transfer-ESC (8a).

Figure 6:
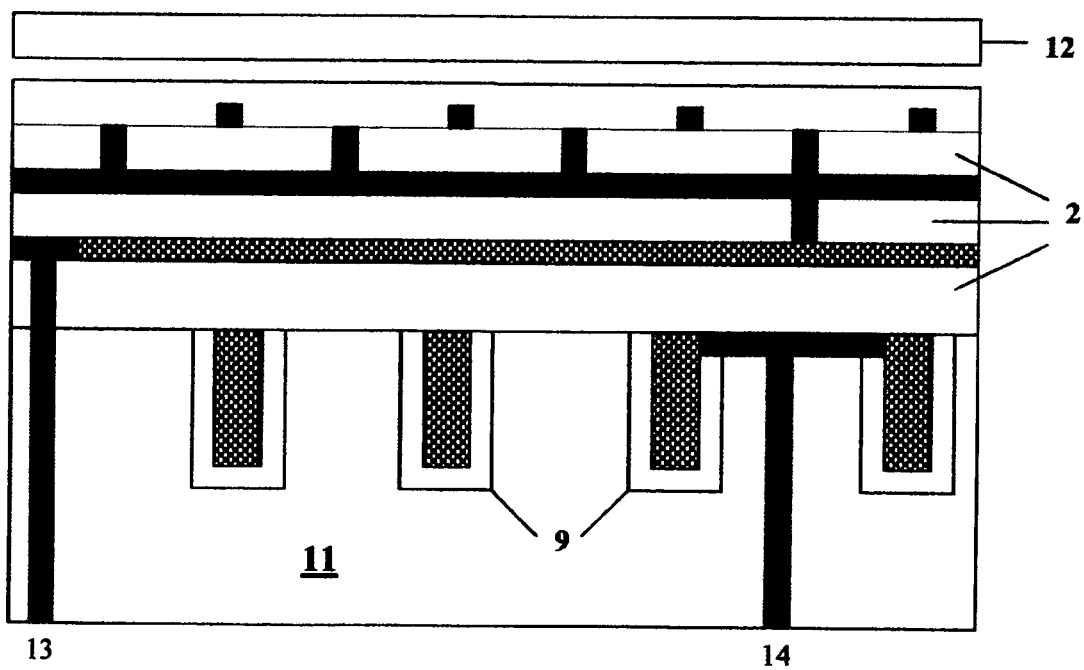
FIG. 6 shows a cross section view of additional integrated capacitors, embedded in the base-material of the Transfer-ESC, and the process-wafer to be clamped thereon. It also shows the backside contacts for charging and de-charging of the electrodes as well as separated contacts for autarky capacitors.

FIG. 6 shows a more general cross section overview than FIG. 5 with the structure elements described above, which is also showing the base-material (11) of the Transfer-ESC and the process-wafer (12) clamped thereon. The base-material (11) of a Transfer-ESC is a semiconductor wafer itself, preferably a silicon wafer. The external contacts (13) for charging and de-charging of the electrodes are typically located on the backside of the Transfer-ESC, as it is described in DE 102004041049 A1 or DE 102004030723 A1. For the additional storage of energy (current), capacitors (9) are brought into the base-material (11), perpendicular to the surface area (8a). Those capacitors (9) can be created by deep-trench-techniques and they enable a longer clamping time of the Transfer-ESC by supplying extra energy to the electrodes. The details of the connections of the electrodes and the capacitors (9) are not needed to be shown here because they are well known from the IC manufacturing design and processing. The use of silicon wafers gives the opportunity to integrate common semiconductor-components, like measurement- or control-units, processors or data storage units, because the needed clamping means—electrode-unit-cells (10), bus-system (7) and integrated fuses (5)—for the Transfer-ESC are located in layers on top of the base-material (11). Active and passive components like transistors, diodes, or resistors are preferably integrated in the base-material (11). However, the application temperature of those semiconductor-components is typically limited to lower temperatures (<120 degree Celsius). The current and voltage supply of those active and passive components is carried out self-sufficient, using autarky capacitors (9), batteries or accumulators. This self-sufficient power supply is not, or only for measurement or control purposes, linked to the electrodes of the Transfer-ESC. Those dedicated capacitors (9) or accumulators will be charged using separate contacts (14) of the Transfer-ESC. Integrated active and passive components can be designed to store relevant process parameters like time, temperature or process flow during the manufacturing of the clamped thin wafer (12). Parameters can be read out using special data ports which also can be used for programming. The interface for the data ports is not shown in detail here. By using an integrated control-unit, it is possible to switch on or off electrodes of the Transfer-ESC. High-voltage-DMOS transistors, which can be completely dielectric insulated, or other appropriate types of bipolar- or MOS-transistors work as solid state switches and can be triggered using the bus-system (7), driven by an integrated control-unit. An application for this kind of controlled switching of electrodes is the pick and placing of chips. Electrodes can be programmed to be "on" or "off", which can influence and regulate the clamping force for certain areas of the Transfer-ESC to the clamped process wafer (12). Switching off electrodes in the centre of the Transfer-ESC will relatively increase the force on the edge. Combined with the clamping voltage of the Transfer-ESC, the clamping forces can be varied, so adopted forces for concave and convex bowed wafer (12) can be created. An example for a useful application of this variation is the photolithography. The flatness of a clamped process-wafer (12) has a very important impact on the resolution of critical dimensions. A very high number of electrodes are needed to adjust local imperfections of the flatness of a process-wafer (12) accordingly. Linked to a flatness measurement tool and a feedback loop of those measurement results to a control-unit of the Transfer-ESC, a closed loop can be created to measure, change and control the flatness of a chucked process-wafer (12).

Transfer-ESC, which are produced using a thick-film technology, are not able to reach a similar flatness. Print- and sinter-processes generate microscopic small peaks and valleys on the top dielectric layer (8) which are in the range of about 3 to 30 µm in height each. This is causing an additional gap between the flat wafer (12) and the surface of the Transfer-ESC (8a). Thus the effective thickness of the top dielectric layer (8) will be increased. But with an increased thickness of the dielectric layer (d) the clamping force reduces drastically.

The Transfer-ESC with wafer as base-material (11) is as flat as a production wafer (12) and for this reason they are the best fit for this application. This flatness is especially needed to generate the extra force component of a non-uniform electric filed which needs a close proximity of a few micrometers between the process-wafer (12) and the surface of the Transfer-ESC (8a).

The advantage of the invention is that a Transfer-ESC with a high amount of electrode-unit-cells, as well as further integrated semiconductor components can be produced on a base-wafer made from silicon with common processes and technologies of the IC industry. The application of peak-electrodes enables to generate a non-uniform electric field, which effectively clamps wafers in close proximity. The use of very pure materials and sophisticated processes enables to build up nearly defect free dielectric layers with a very flat surface. Microscopic imperfections like a rough surface or particles can be reduced or avoided by using IC manufacturing technologies and environments. The integration of fuses, which enables to keep the functionality of electrodes if a defect is destroying some electrode-unit-cells, is also an important advantage. In this way a very robust, for temperatures above 300 degree Celsius suitable, highly effective, mobile, transportable electrostatic chuck for thin wafer clamping can be manufactured, made from a semiconductor wafer itself. Using a silicon wafer as a base material (or other suitable materials to integrate semiconductor components) to produce a Transfer-ESC, provides the opportunity to integrate other semiconductor components like measurement- or control-units, processors or data storage units within a Transfer-ESC. Single electrodes can be switched "on" or "off" by using solid state switches. The use of the same material for the wafer and the Transfer-ESC reduces or even eliminates mechanical stress, because the thermal expansion coefficient is the same.

REFERENCE LIST FOR THE DRAWINGS inside peak-electrode (1)
lateral insulator layer (2)
surrounding electrode (3)
cluster of electrode-unit-cells (4)
integrated fuse (5)
serpentine like allocated line (6)
bus-system (7)
top dielectric layer (8)
surface of the Transfer-ESC (8a)
capacitor (9)
electrode-unit-cells (10)
semiconductor base-material of the Transfer-ESC (11)
process-wafer to be clamped on the Transfer-ESC (12)
external contacts (13) for the electrodes (13)
separate contacts (14) for autarky capacitors (14)

The invention claimed is:

1. A mobile, transportable electrostatic chuck comprising a first surface (8a) for electrostatically clamping a thin process-wafer (12) thereon by applying a clamping voltage, without permanent connection to an external power supply unit for transportation or other process steps, where the size and thickness of the clamped process-wafer and the mobile chuck is similar of size, thickness and shape as a standard wafer comprising:
   a semiconductor base-material (11) with electrodes on top, which create a non-uniform electric field, wherein each said electrode comprises a plurality of clusters built up modularly from a plurality of single, bipolar electrode-unit-cells (10);
   each of said electrode-unit-cell (10) comprising one inside peak-electrode (1), a lateral insulator layer (2), a surrounding electrode (3) and a top dielectric layer (8).

2. The mobile chuck as set forth in claim 1, wherein each electrode-unit-cell (10) has a length of no more than 5 μm and a width of no more than 5 μm.

3. The mobile chuck as set forth in claim 1, wherein each said cluster (4) is built up from 4 up to 100,000 said electrode-unit-cells (10).

4. The mobile chuck as set forth in claim 1, wherein each said cluster (4) is linked to one or more integrated fuses (5).

5. The mobile chuck as set forth in claim 1, wherein integrated semiconductor-components are integrated within the said semiconductor base-material (11).

6. The mobile chuck as set forth in claim 1, wherein active and passive semiconductor-components are supplied self-sufficient with energy, comprising autarky capacitors (9), batteries or accumulators.

7. The mobile chuck as set forth in claim 1, wherein solid state switches integrated in the said semiconductor base-material (11) are applied to switch on or off said electrodes.

* * * * *